US006691076B1

United States Patent
Nagase et al.

(10) Patent No.: US 6,691,076 B1
(45) Date of Patent: Feb. 10, 2004

(54) ELECTROMAGNETIC FIELD INTENSITY CALCULATING METHOD AND A STORAGE MEDIUM FOR STORING A PROGRAM FOR EXECUTING THE METHOD

(75) Inventors: Kenji Nagase, Kawasaki (JP); Makoto Mukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/532,788

(22) Filed: Mar. 22, 2000

(30) Foreign Application Priority Data

Apr. 28, 1999 (JP) ............................................ 11-122063

(51) Int. Cl.[7] .......................... G06F 17/50; G06F 17/10
(52) U.S. Cl. .................................. 703/2; 703/4; 703/5
(58) Field of Search .............................. 703/13, 2, 3, 4, 703/5

(56) References Cited

U.S. PATENT DOCUMENTS

| | | | | |
|---|---|---|---|---|
| 5,751,600 A | * | 5/1998 | Ochi et al. | 702/64 |
| 5,812,434 A | * | 9/1998 | Nagase et al. | 703/2 |
| 5,940,310 A | * | 8/1999 | Yamaguchi et al. | 703/4 |
| 6,083,266 A | * | 7/2000 | Ohtsu et al. | 703/2 |

OTHER PUBLICATIONS

Electromagnetic scattering and radiation by surfaces of arbitrary shape in layered media. II. Implementation and results for contiguous half–spaces Michalski, K.A.; Zheng, D. Antennas and Propagation, IEEE Transactions on, vol.: 38 Issue: 3, 3/90, 345–352.*

"EMI analysis of finite sized image planes configuration using triangular patch model," Kim, J.S.; Yun, J.H.; Lee, A.K.; Kim, N. Electronics Letters, vol : 34 Issue: 18, Sep. 3, 1998 pp: 1735–1736.*

"Quadrature rules for numerical integration over triangles and tetrahedral," Savage, J.S.; Peterson, A.F. IEEE Antennas and Propagation Magazine, vol.: 38 Issue: Jun. 3, 1996 pp.: 100–102.*

"A package analysis tool based on a method of moments/ surface formulation," Ponnapalli, S.; Bertin, R.; Deutsch, A. Proceedings of the 43rd Electronic Components and Technology Conference, 1993 pp: 615–622.*

* cited by examiner

Primary Examiner—Russell Frejd
(74) Attorney, Agent, or Firm—Staas & Halsey LLP (57) ABSTRACT

A method for calculating the intensity of an electromagnetic field emitted from a device and a storage medium for storing a program of the method are disclosed. The method uses a moment method in which a mutual impedance between shell elements and a supplied voltage are assumed to be known quantities and the current flowing through the shell element is assumed to be an unknown quantity. The method comprises the steps of obtaining a plurality of shell elements including at least one triangular shell element by virtually dividing the device into a mesh, and setting an unknown quantity of a current directed from each side of the triangular shell element toward its apex only when a conductive wire is connected to the apex, setting an unknown quantity of a current directed from each side of the triangular element toward its apex when the side is common with a side of the other shell element, or setting an unknown quantity of a current parallel to a side of the triangular shell element when there is a shell element adjacent to the triangular shell element.

9 Claims, 7 Drawing Sheets

Fig.10

ELECTROMAGNETIC FIELD INTENSITY CALCULATING METHOD AND A STORAGE MEDIUM FOR STORING A PROGRAM FOR EXECUTING THE METHOD

BACKGROUND OF THE INVENTION

1. Field of the Invention

The present invention relates to an electromagnetic field intensity calculating method and a storage medium for storing a program for executing the method. The electromagnetic wave is emitted from a device such as a printed circuit board, a body of a vehicle, or a rear window of a vehicle in which an antenna is embedded.

The strength of the electromagnetic wave emitted from electronic devices must be suppressed within a certain permitted range, regardless of whether the electromagnetic emission is necessary or not. To this end, it is necessary to calculate, by simulation, the intensity of the electromagnetic field considered to be emitted from a device under consideration.

2. Description of the Related Art

In a conventional electromagnetic field calculating method, the surface of the device under consideration is virtually divided into a mesh of a plurality of small elements. Hereinafter, the small elements are referred to as shell elements. Each of the shell elements has a rectangular shape, and the intensity of the electromagnetic field emission is calculated by estimating a current considered to flow through each shell element.

There is, however, a problem in that the intensity of the electromagnetic emission cannot be calculated when the shell element has the shape of a triangle such as one at the corner of the device under consideration. This problem will be described with reference to FIG. 9 and FIG. 10.

Figure 9:
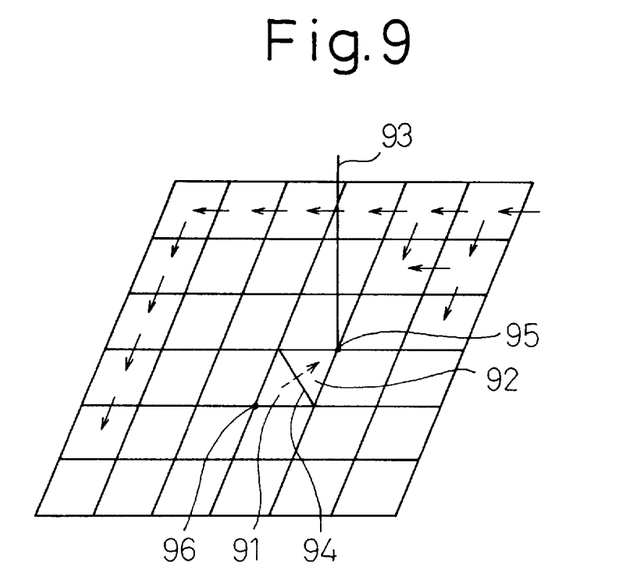
FIG. 9 is a diagram showing a part of the surface of a device under consideration in which the surface is virtually divided into mesh.

FIG. 9 is a diagram showing a part of the surface of a device under consideration in which the surface is virtually divided into a mesh.

In the figure, all of the shell elements, other than the shell elements 91 and 92 each having a shape of a triangle, are rectangular. An electric current, which is considered to flow each side of a rectangular shape of a shell element, can be considered to continuously flow across the opposite side of the shell element. Therefore, the current can be calculated according to the well-known moment method. The vector quantities of the currents are illustrated in the figure by solid arrows.

On the other hand, the quantity of a current considered to flow from each side of a shell element 91 or 92 having a triangular shape toward the apex of the triangle can be calculated only when there is a current route from the apex to a point other than the apex. When there is no current route from the apex to a point other than the apex, the current quantity must be set to zero. For example, when a wire element 95 is connected to the apex 95 of the triangular shell element 92, the current considered to flow across the side 94 can be calculated. However, when nothing is connected to the apex such as the apex 96 of the triangular shell element 91, the current considered to flow across the side 94 must be set to zero.

Figure 10:
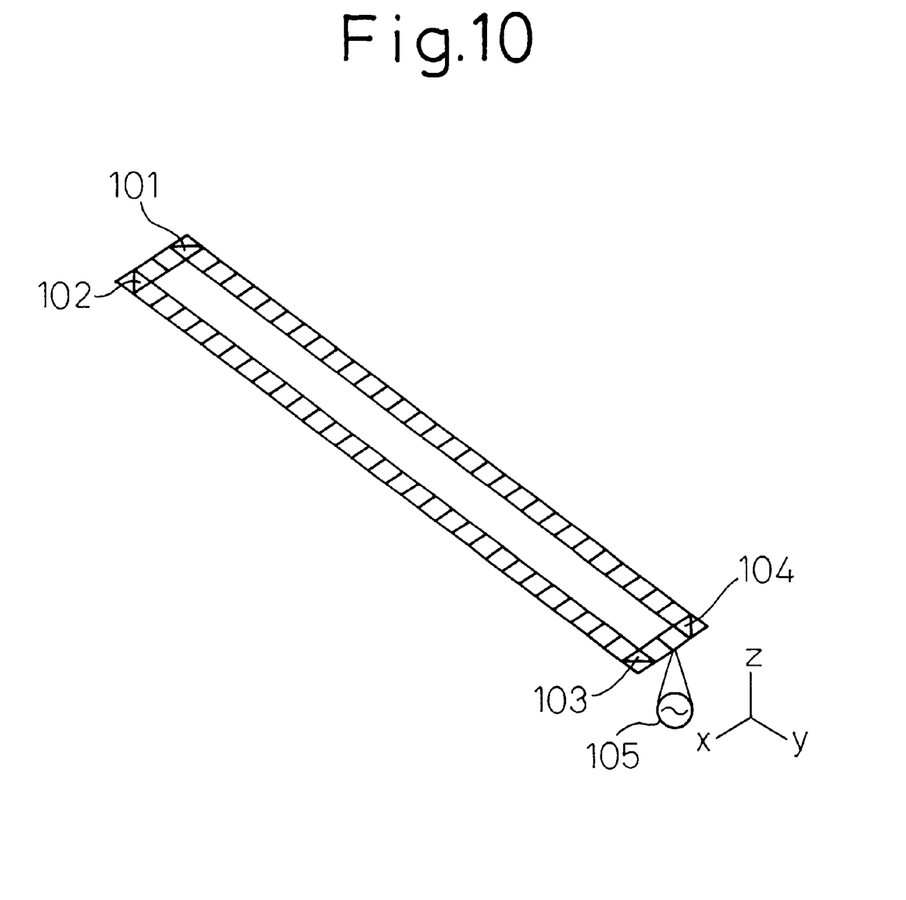
FIG. 10 is a diagram showing a current considered to flow according to a conventional electromagnetic field intensity calculating method explained with reference to FIG. 9.

FIG. 10 is a diagram showing an electric current flowing through a certain pattern. The current is calculated in accordance with the conventional method of calculating electromagnetic field intensity. The device under consideration as illustrated in the figure has a pattern width of 1 mm, a pattern interval of 2 mm, and a characteristic impedance of 294Ω. When a current flowing through this device is calculated in accordance with the conventional electromagnetic field intensity calculating method under the condition that a current of 200 mA with a frequency of 30 MHz is supplied from a power supply 85 to this device, the calculated current will be zero. This is because, in triangular shell elements 101, 102, 103, and 104 which are present in the corners of the pattern, it is assumed that the current across each side to its opposite apex is zero. In practice, however, a certain finite current must flow through the device. Therefore, in case of the device as shown in FIG. 10, the actual intensity of the electromagnetic emission can not be calculated in accordance with the conventional electromagnetic field intensity calculating method.

SUMMARY OF THE INVENTION

An object of the present invention is to provide an electromagnetic field intensity calculating method which can calculate the electromagnetic field intensity emitted from a device under consideration even when the shape of a shell element is triangle, and even when a wire element is not connected to an apex of the triangle.

To attain the above object, there is provided, according to the present invention, an electromagnetic field intensity calculating method for calculating the intensity of electromagnetic field emitted from a device under consideration, by using a moment method in which a mutual impedance between shell elements and a supplied voltage are assumed to be known quantities and the current flowing through the shell element is assumed to be an unknown quantity. The method comprises the steps of obtaining a plurality of shell elements including at least one triangular shell element by virtually dividing the device under consideration into mesh, and setting an unknown quantity of a current directing from each side of the triangular shell element toward its apex only when a conductive wire is connected to said apex, setting an unknown quantity of a current directing from each side of the triangular element toward its apex when said side is common with a side of the other shell element, or setting an unknown quantity of a current parallel to a side of the triangular shell element when there is a shell element adjacent to the triangular shell element.

For all of the three congruent triangles, the step of setting an unknown quantity of a current repeats the steps of selecting one shell element from the plurality of shell elements, determining the shape of the selected shell element, preparing, when the selected shell element is judged to be triangle as a result of the judgement, three triangles which are congruent with the selected triangular shell element, making a correspondence between one of apexes of each of the triangles and a starting point of a current which is assumed to direct to the outside of each of the three congruent triangles in such a way that the starting point of one of the congruent triangles corresponds to an apex of the one of the congruent triangles, and, when the corresponding apexes of the three congruent triangles overlap, the position of the starting point of one of the triangle is different from any one of the positions of the other starting points of the other triangle, selecting, in a triangle, a side opposite to one of the starting points, judging whether or not a conductive element is connected to the starting point opposite to the selected side, setting, when it is judged that a conductive element is connected to the starting point opposite to the selected side, an unknown quantity of a current directing from the selected side toward the starting point, judging, when it is judged that the conductive element is not connected to the starting point of the selected triangle, whether or not there is a shell element adjacent to a side other than the selected side of the selected triangle shell element, setting, when it is judged that there is not a shell element adjacent to a side other than the selected side of the selected triangle shell element, an unknown quantity of a current directing from the selected side toward the starting point, and setting, when it is judged that there is a shell element adjacent to a side other than the selected side of the selected shell element, an unknown quantity of a current parallel to one side of the triangle in such a way that a current flows into the adjacent shell element.

The unknown quantity of the current parallel to one side of the triangle is obtained by integrating the unknown quantity of the current parallel to the side from each side to the apex opposite to the side except for the apex.

BRIEF DESCRIPTION OF THE DRAWINGS

The above object and features of the present invention will be more apparent from the following description of the preferred embodiments when read in conjunction with the accompanying drawings, wherein.

DESCRIPTION OF THE PREFERRED EMBODIMENTS

Figure 1A:
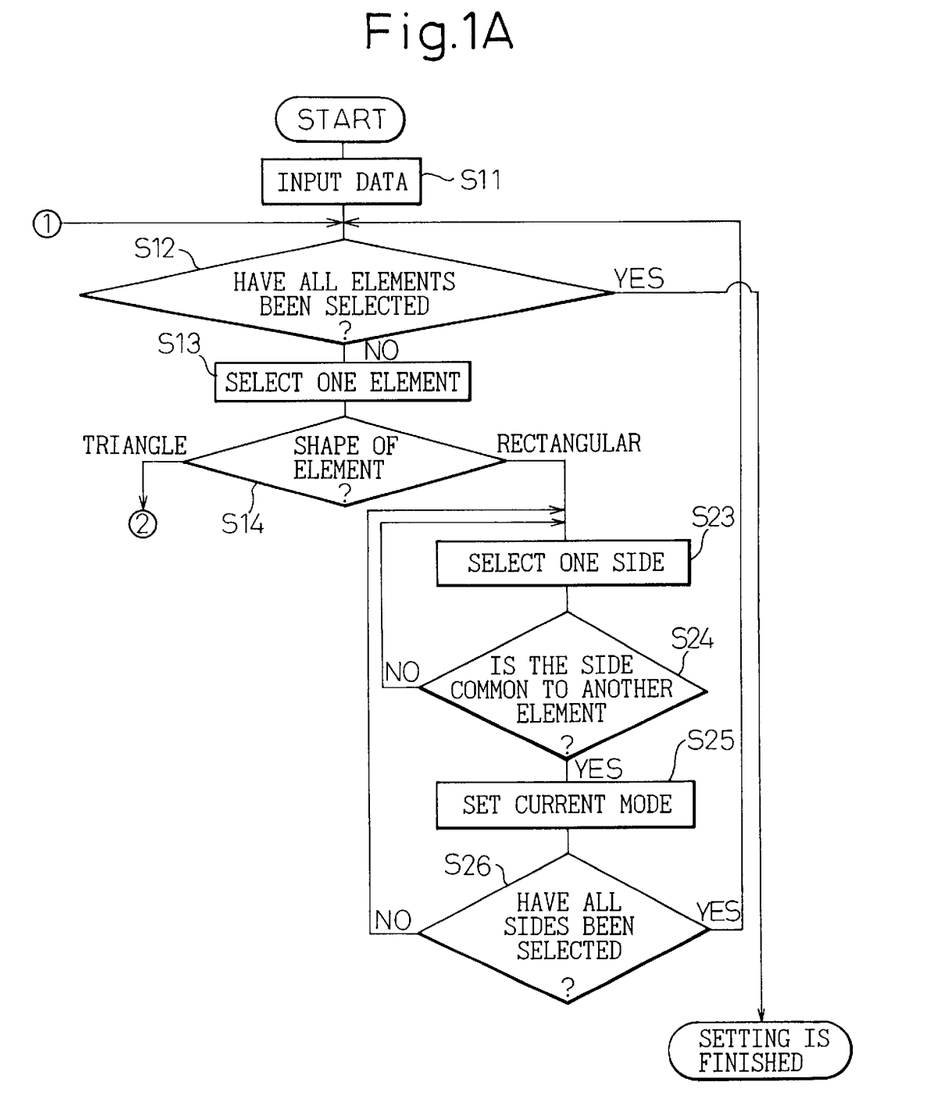
FIGS. 1A and 1B are a flowchart for explaining an electromagnetic field intensity calculating method, according to the present invention.
Figure 1B:
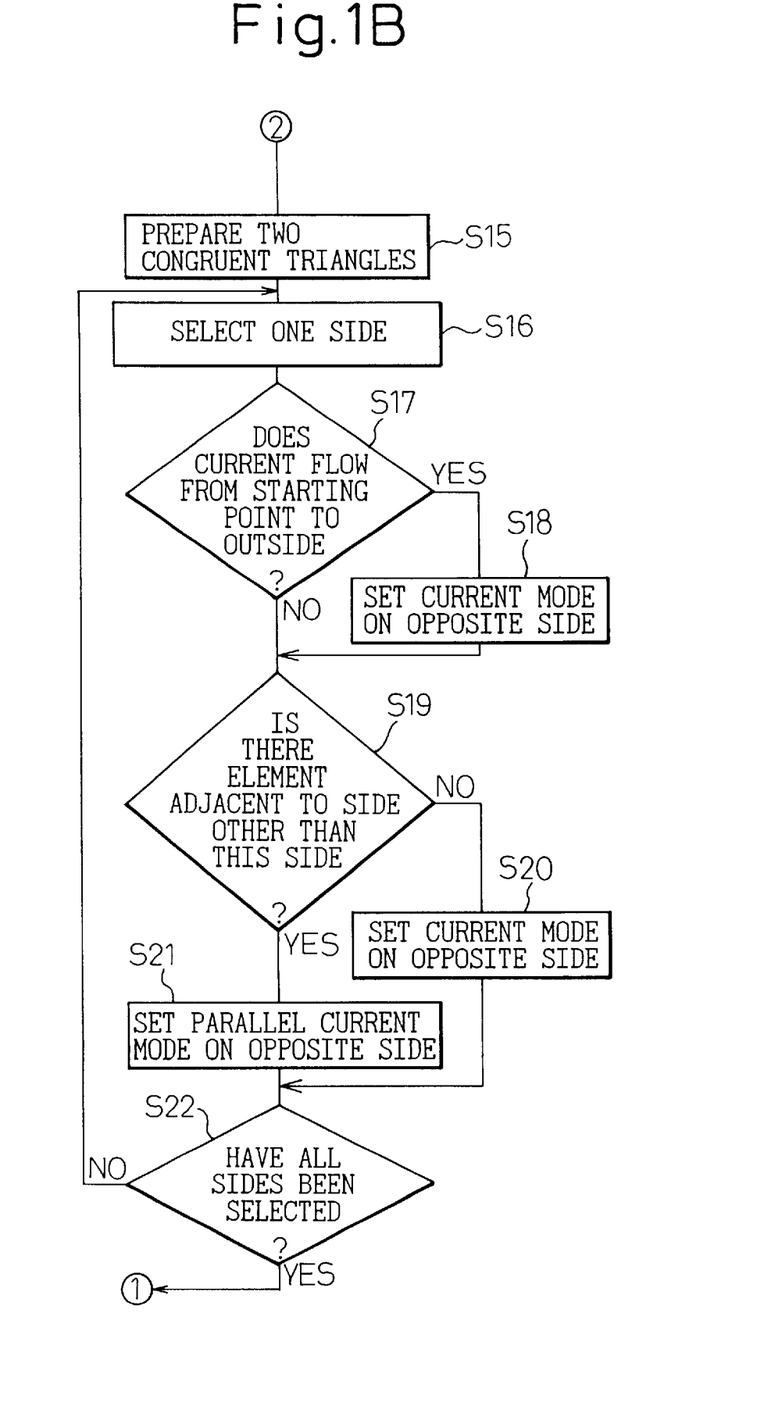

FIGS. 1A and 1B are a flowchart for explaining an electromagnetic field intensity calculating method, according to the present invention. This method shown by the flowchart is executed by a not-shown computer. In the figure, at step S11, data is input. As the input data, there are, for example, coordinates of shell elements of a device under consideration, a condition of an A.C. power supply such as a condition to conduct a current of 20 mA with a frequency of 30 MHz, a characteristic of the material of the device under consideration such as a conductivity of a metal of a wiring pattern, or the like. Then at step S12, it is determined whether or not all of the shell elements have been selected. If all of the shell elements have been selected, the process to set currents in all of the shell elements is completed. If at least one of the shell elements has not been selected, the process proceeds to step S13 where one shell element is selected. Then at step S14, the shape of the selected shell element is determined. As a result of the determination, if the shape is triangle, the process proceeds to step S15 where two triangles each of which is congruent with the selected shell element are formed.

Figure 2:
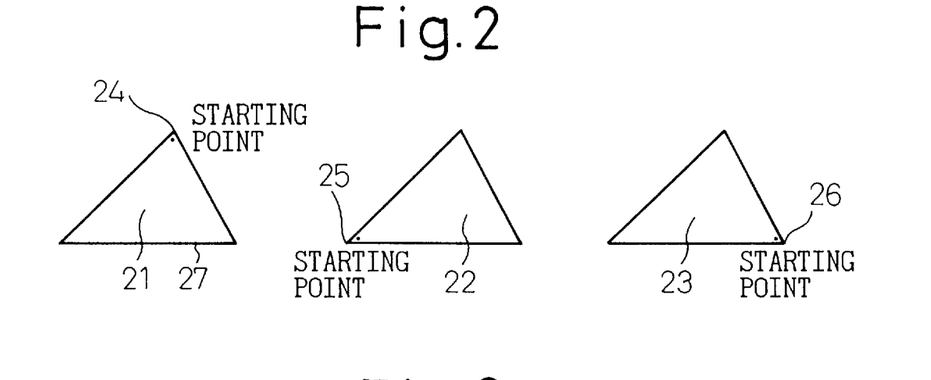
FIG. 2 is a diagram showing one triangle judged in step S14 in the flowchart of FIG. 1 and two triangles which are congruent with the one triangle.

FIG. 2 shows one shell element 21, the shape of which is judged to be a triangle at step S14 and two triangles 22 and 23 which are each congruent with the triangle 21. In FIG. 2, it is assumed that a starting point of a current, which is considered to flow to the outside of each of the three triangles congruent to each other, corresponds to one of an apex of each of the triangles 21 to 23. In addition, when the three triangles 21–23 are completely overlapped by making the respective apexes of one triangle to correspond to the other respective apexes of the other triangles, the starting points 24–26 of the respective triangles 21–23 are made to correspond to different apexes of the congruent triangles. That is, the starting point 24 in the triangle 21 is made to correspond to one of the apexes of the triangle 21; the starting point in the triangle 22 is made to correspond to one of the apexes of the triangle 22; and the starting point in the triangle 23 is made to correspond to one of the apexes of the triangle 23. The above-mentioned correspondence is made in such a way that, when the three triangles 21–23 are completely overlapped by making the respective apexes of one triangle to correspond to the other respective apexes of the other triangles, the starting points 24–26 of the respective triangles 21–23 are made to correspond to different apexes of the congruent triangles. The reason why the two triangles which are congruent with the selected triangular shell element are prepared is because it is convenient for the computer program to efficiently perform the calculation of mutual impedance, or calculation of voltages in addition to the setting of the unknown quantities of currents.

Returning to FIG. 1B, at step S16, one of the sides of one of the triangles 21–23 is selected in such a way that the selected one side is opposite to the starting point in the triangle. For example, in FIG. 2, a side 27 opposite to the starting point 24 in the triangle 21 is selected.

Figure 3:
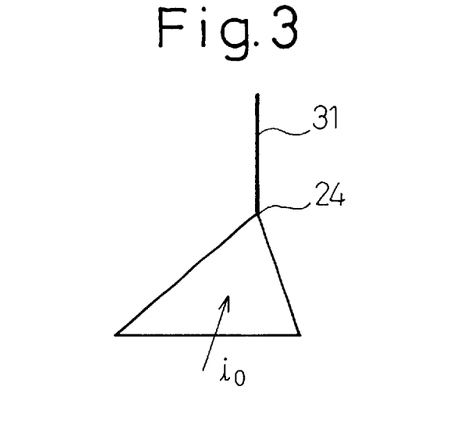
FIG. 3 is a diagram explaining the case where a wire element such as an antenna is connected to a starting point of a triangle.

Then, at step S17, it is judged whether or not a current can flow from the starting point opposite to the selected side to the outside of the triangle. For example, when the selected side is the side 27 in FIG. 2, it is judged whether or not a current can flow from the starting point 24 opposite to the side 27 to the outside of the triangle 21. This judgement can be done by judging whether or not a conductive element is connected to the starting point. For example, as shown in FIG. 3, when a wire element 31 such as an antenna or the like is connected to the starting point 24 of the triangle 21, it can be considered that a current must flow to the wire element 31 which is placed outside of the triangle and is connected to the starting point 24, and consequently the current must flow across the side 27 opposite to the starting point 24.

As a result of the judgement at step S17, when it is judged that a current must flow from the starting point to the outside of the triangle, then at step S18, a current mode is set on the side opposite to the starting point. In the following, the expression "a current mode is set" means "an unknown quantity of the current is set". For example, in case of the example shown in FIG. 3, an unknown quantity $i_0$ of the current which must flow from the side 27 to the starting point 24 is set.

As a result of the judgement at step S17, when it is judged that a current must not flow from the starting point to the outside of the triangle, the process proceeds to step S19 where it is judged whether or not there is a shell element adjacent to a side other than the selected side of the selected shell element.

When it is judged that there is no shell element adjacent to a side other than the selected side of the selected shell element as a result of the judgement at step S17, or when a current mode is set on the opposite side, the process proceeds to step S19 where it is judged whether or not there is a shell element adjacent to a side of the selected triangular shell element other than the selected side of the selected triangular shell element.

Figure 4:
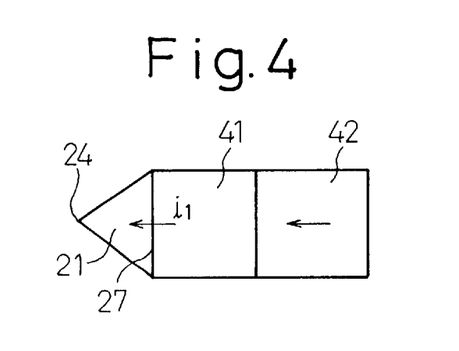
FIG. 4 is a diagram explaining a case where there is only one shell element adjacent to a triangle.

As a result of the judgement at step S19, when it is judged that there is no shell element adjacent to a side of the selected triangular shell element other than the selected side of the selected triangular shell element, the process proceeds to step S20 where a current mode is set on the selected side. For example, when there is only one shell element such as a rectangular shell element 41 as shown in FIG. 4 as the other shell element adjacent to the triangle 21, there is no shell element adjacent to the side other than the side 27. In this case, at step S20, an unknown quantity $i_1$ of a current directing from the selected side 27 to the starting point 24 is set.

In this way, even when a conductive element is not connected to a starting point opposite to the selected side, when there is no shell element adjacent to a side other than the selected side, the unknown quantity of a current on the selected side is set. This is because, if the unknown quantity is not set, an error in the estimated current would become large. For example, in case of FIG. 4, if the current $i_1$ directing from the side 27 to the starting point 24 is not set, the current to be conducted through the rectangular shell elements 41 and 42 would have no destination, so that the estimated current would become different from the actual current flowing through the device under consideration.

Figure 5:
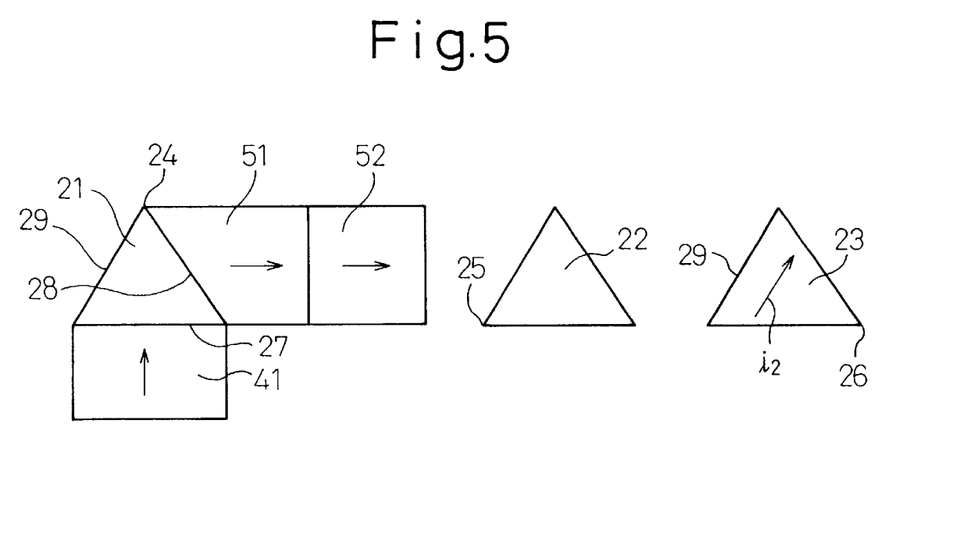
FIG. 5 is a diagram explaining a case where there is a shell element adjacent to a side other than the selected side of the triangular shell element.

As a result of the judgement at step S19, when there is a shell element adjacent to a side other than the selected side of the selected triangular shell element, the process proceeds to step S21 where parallel current modes are set on the side common to the adjacent shell element and on sides other than the side selected at step S16. In an example shown in FIG. 5, when the triangular shell element 21 is sandwiched between rectangular shell elements 41 and 51, there is a rectangular shell element 51 adjacent to a side 28 other than the selected side 27, so that an unknown quantity $i_2$ of a current parallel to a side 29, which is the side other than the sides 27 and 28, is set. This parallel current is set by utilizing, among the triangles congruent with the selected triangular shell element 21, the triangle 23 having a starting point at an apex opposite to a side 29.

Figure 6:
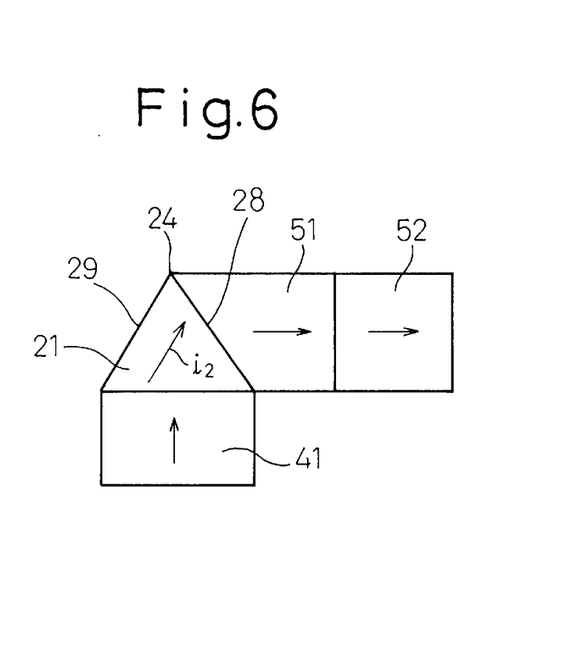
FIG. 6 is a diagram showing a state in which unknown quantities of parallel currents in respective triangular shell elements are set.

FIG. 6 is a diagram showing a state in which the unknown quantity $i_2$ of the parallel current is set in the triangular shell element 21. As shown in the figure, the unknown quantities of the current are set in not only the rectangular shell elements 41, 51 and 52, but also in the triangular shell element 21.

Referring again to FIG. 1B, at step S22, it is judged whether or not all of the sides have been selected. If not, the steps S16–S21 are repeated. If all of the sides have been selected, the process returns to step S12 where it is judged whether or not all of the shell elements have been selected. If not, step S13 is repeated again. If all of the shell elements have been selected, the current mode setting process is completed.

According to the above-described method, since an unknown quantity of a current in a triangular shell element can be set, in general, regardless of the location of a triangular shell element in the device under consideration, an analyzing model of the device for calculating the intensity of electromagnetic field emitted from the device can be easily prepared, and the accuracy of the calculation of the electromagnetic field intensity can be improved.

It should be noted that, when the shape of the shell element selected at step S14 is rectangular, a current mode is set according to the conventional method. That is, at step S23, one side of the rectangular is selected; and at step S24, it is judged whether the selected side is also the side of the other shell element. If it is so, a current mode is set on the side. If the selected side is not the side of the other shell element, the process returns to step S23 to select another side. At step S25, when the setting of the current mode is completed, the process proceeds to step S26 where it is judged whether or not all of the sides have been selected. If not, the process returns to step S23 to select another side. If all of the sides have been selected, the process returns to step S12.

Figure 7:
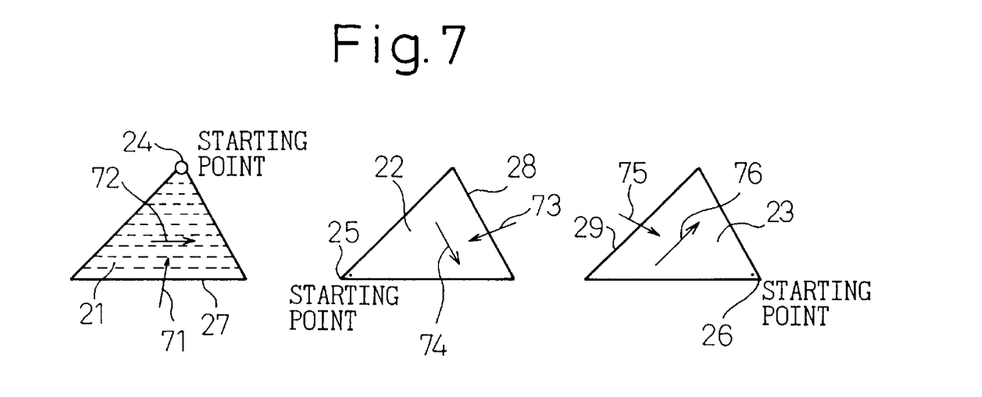
FIG. 7 is a diagram explaining current modes which can be set in a triangular shell element.

FIG. 7 is a diagram for explaining a current mode which can be set in the above-mentioned triangular shell element. In the figure, unknown quantities of currents which can be set in the triangular shell element shown in FIG. 2 and two triangles 22 and 23 which are congruent with the triangular shell element 21 are shown. In the triangular shell element 21, an unknown quantity 71 of a current directing from the opposite side 27 to the starting point 24 and an unknown quantity of a current parallel to the opposite side 27 can be set. In the triangle 22, an unknown quantity 73 of a current flowing from the opposite side 28 to the starting point 25 and an unknown quantity of a current parallel to the opposite side 28 can be set. In the triangle 23, an unknown quantity 75 of a current flowing from the opposite side 29 to the starting point 26 and an unknown quantity of a current parallel to the opposite side 29 can be set. That is the total number of the unknown quantities of the currents which can be set in the triangular shell elements are six, i.e., the three unknown quantities of the currents directing from the opposite sides 27, 28, and 29 to the opposite starting points 24, 25, and 26 respectively, and the three unknown quantities of the currents 71, 73, and 75 of the currents parallel to the opposite sides 27, 28, and 29 respectively. Among these six unknown quantities which can be set, unknown quantities which are to be actually set are selected. That is, the unknown quantity of the current directing toward the starting point is selected to be set only when a conductive element is connected to the starting point. The unknown quantity of the current parallel to the opposite side is selected to be set only when the opposite side is common with the side of the other shell element. In the example shown in FIG. 6, since the side 28 which extends to the direction of the unknown quantity $i_2$ of the current is common with the side of the other shell element 51, the unknown quantity $i_2$ of the current parallel to the side 29 is selected to be set.

It should be noted that the unknown quantity 72 of the current parallel to the side 27 is obtained by integrating the unknown quantities of currents along line segments parallel to the side 27 of the triangle 21. The line segments are those from the position of the side 27 to the starting point 24 except for the starting point 24. Similarly, the unknown quantities 74 and 76 can be obtained by integrating unknown quantities along the opposite side except for the starting points.

Figure 8:
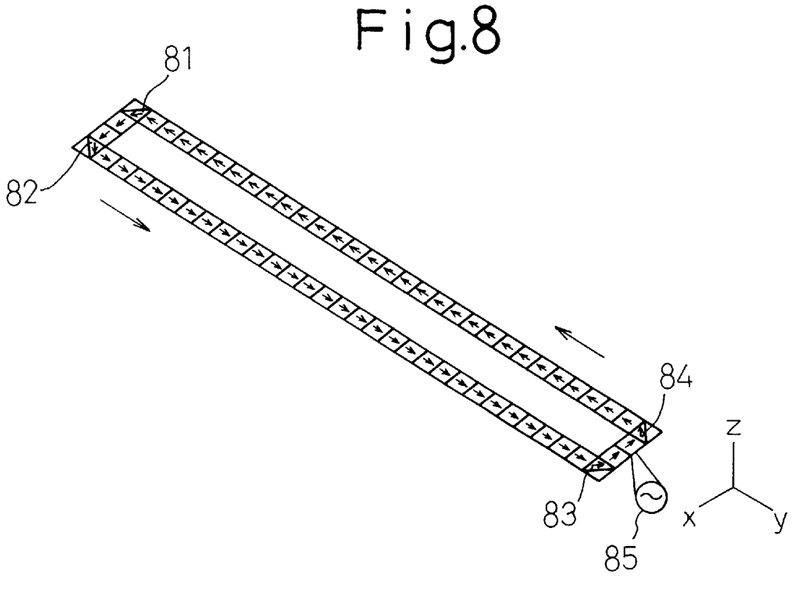
FIG. 8 is a diagram showing the set state of unknown quantities of current assumed to flow through the device under consideration when the unknown quantities of currents in triangular shell elements are set.

FIG. 8 is a diagram showing the set unknown quantities of the current flowing through the device under consideration. The illustrated device is a pattern having a pattern width of 1 mm, a pattern interval of 2 mm, and the characteristic impedance of 294Ω. When a current having a frequency of 30 MHz and a value of 200 mA is supplied from a wave source 85, since unknown quantities of currents parallel to the side opposite to the starting points can be set, according to the electromagnetic field intensity calculating method of the present invention, in triangular shell elements 81, 82, and 83 which are present on the corners of the pattern, the problem in the prior art, that is, a current is cut at the corner, is eliminated.

From the foregoing description, it will be apparent that, according to the present invention, since an unknown quantity of a current can be set in a triangular shell element, the current flowing through the device under consideration can be calculated even when shell elements, which are obtained by dividing the device under consideration into a mesh, include a triangular one, so that the intensity of the electromagnetic field can be calculated accurately and, consequently, the analyzing model of the device under consideration can be easily formed.

What is claimed is:

1. A method of calculating an intensity of an electromagnetic field emitted from a device by using a moment method, comprising:

obtaining a plurality of shell elements including at least one triangular shell element by virtually dividing said device into a mesh, wherein a mutual impedance between the plurality of shell elements and a supplied voltage are known values and a current flowing through the at least one triangular shell element is an unknown quantity; and one of:

setting an unknown quantity of a current directed from each side of said triangular shell element toward an opposing apex when a conductive wire is connected to said opposing apex, setting an unknown quantity of a current directed from each side of said triangular shell element toward the opposing apex when said side is common with a side of another shell element, and setting an unknown quantity of a current parallel to a side of said triangular shell element when another shell element is adjacent to said triangular shell element, wherein said setting an unknown quantity of a current comprises:

selecting a first shell element from said Plurality of shell elements;

determining a shape of said first shell element;

preparing, when said first shell element is triangular, a first congruent triangle and a second congruent triangle, wherein the first congruent triangle and the second congruent triangle are congruent with said first shell element, yielding three congruent triangles;

setting up a first correspondence between a first apex of the first shell element and a first starting point of a first current, a second correspondence between a second apex of the first congruent triangle and a second starting point of a second current, and a third correspondence between a third apex of the second congruent triangle and a third starting point of a third current, wherein each of said first, second and third currents is directed to an outside of a respective congruent triangle of said three congruent triangles, so that, if the three congruent triangles were overlapped, the first, the second and the third starting points, respectively, are not overlapping;

selecting, in one of the three congruent triangles, a side opposite to a selected one of said starting points to yield a selected side;

judging whether a conductive element is connected to the selected one of said starting points opposite to said selected side;

setting, when a conductive element is connected to the selected one of said starting points opposite to said selected side, an unknown quantity of a current directed from said selected side toward said selected one of said starting points;

judging, when the conductive element is not connected to the selected one of said starting points of said one of the three congruent triangles, whether a shell element is adjacent to a side other than said selected side of said one of the three congruent triangles;

setting, when a shell element is not adjacent to a side other than said selected side of said one of the three congruent triangles, an unknown quantity of a current directed from said selected side toward said selected one of said starting points;

setting, when a shell element is adjacent to a side other than said selected side of said one of the three congruent triangles, an unknown quantity of a current parallel to one side of said one of the three congruent triangles in such a way that a current flows into said shell element that is adjacent to the side other than said selected side; and repeating above operations until all sides of said three congruent triangles have been selected.

2. The method according to claim 1, wherein the unknown quantity of the current parallel to the side of said triangular shell element is obtained by integrating the unknown quantity of the current parallel to said side from each side to an apex opposite to said side except for an apex representing a starting point.

3. A storage medium of storing a program of a method of calculating an intensity of an electromagnetic field emitted from a device by using a moment technique, said program comprising:

obtaining a plurality of shell elements including at least one triangular shell element by virtually dividing said device into a mesh, wherein a mutual impedance between the plurality of shell elements and a supplied voltage are known values and a current flowing through the at least one triangular shell element is an unknown quantity; and performing one of:

setting an unknown quantity of a current directed from each side of said triangular shell element toward an opposing apex when a conductive wire is connected to said opposing apex, setting an unknown quantity of a current directed from each side of said triangular shell element toward the opposing apex when said side is common with a side of another shell element, and setting an unknown quantity of a current parallel to a side of said triangular shell element when another shell element is adjacent to said triangular shell element, wherein said setting an unknown quantity of a current comprises:

selecting a first shell element from said plurality of shell elements;

determining a shape of said first shell element;

preparing, when said first shell element is triangular, a first congruent triangle and a second congruent triangle, wherein the first congruent triangle and the second congruent triangle are congruent with said first shell element, yielding three congruent triangles;

corresponding apexes of said three congruent triangles are overlapped, the position of said starting point of one of said triangles is different from any one of the positions of the other starting points of the other triangles;

setting up a first correspondence between a first apex of the first shell element and a first starting point of a first current, a second correspondence between a second apex of the first congruent triangle and a second starting point of a second current, and a third correspondence between a third apex of the second congruent triangle and a third starting point of a third current, wherein said first, second and third currents are directed to an outside of a respective congruent triangle of each of said three congruent triangles, so that, if the three congruent triangles were overlapped, the first, the second and the third starting points, respectively, are not overlapping;

selecting, in one of the three congruent triangles, a side opposite to a selected one of said starting points to yield a selected side:

judging whether a conductive element is connected to the selected one of said starting points opposite to said selected side;

setting, when a conductive element is connected to the selected one of said starting points opposite to said selected side, an unknown quantity of a current directed from said selected side toward said selected one of said starting points;

judging, when the conductive element is not connected to the selected one of said starting points of said one of the three congruent triangles, whether a shell element is adjacent to a side other than said selected side of said one of the three congruent triangles;

setting, when a shell element is not adjacent to a side other than said selected side of said one of the three congruent triangles, an unknown quantity of a current directed from said selected side toward said selected one of said starting points;

setting, when a shell element is adjacent to a side other than said selected side of said one of the three congruent triangles, an unknown quantity of a current parallel to one side of said one of the three congruent triangles in such a way that a current flows into said shell element that is adjacent to the side other than said selected side; and repeating above operations until all sides of said three congruent triangles have been selected.

4. The storage medium according to claim 3, wherein the unknown quantity of the current parallel to the side of said triangular shell element is obtained by integrating the unknown quantity of the current parallel to said side from each side to an apex opposite to said side except for an apex representing a starting point.

5. A method to determine an electric field intensity emitted from a device using a moment technique, comprising:

dividing, virtually, the device into a mesh to provide a plurality of shell elements including a triangular shell element, wherein mutual impedance between shell elements and a supplied voltage are known and a current flowing through the triangular shell element is unknown;

preparing two triangles congruent to the triangular shell element to provide three congruent triangles whose vertices represent three starting points;

for each triangle, using a non-overlapping starting point and:
  if current flows from the starting point to an outside of the triangle or an element fails to be adjacent to a side opposite the starting point, setting a non-zero unknown quantity of a current directed from each side of the triangular shell element toward an opposing apex, and
  if an element is adjacent to a side opposite the starting point, setting a non-zero unknown quantity of a current parallel to a side of the triangular shell element.

6. The method according to claim 5, wherein the non-zero unknown quantity of the current parallel to the side of said triangular shell element is obtained by integrating the unknown quantity of the current parallel to said side from each side to an apex opposite to said side except for an apex representing a starting point.

7. A storage medium for storing a program of a method to determine an electric field intensity emitted from a device using a moment technique, said program comprising the operations of:

dividing, virtually, the device into a mesh to provide a plurality of shell elements including a triangular shell element, wherein mutual impedance between shell elements and a supplied voltage are known and a current flowing through the triangular shell element is unknown;

preparing two triangles congruent to the triangular shell element to provide three congruent triangles whose vertices represent three starting points;

for each triangle, using a non-overlapping starting point and:
  if current flows from the starting point to an outside of the triangle or an element fails to be adjacent to a side opposite the starting point, setting a non-zero unknown quantity of a current directed from each side of the triangular shell element toward an opposing apex, and
  if an element is adjacent to a side opposite the starting point, setting an a non-zero unknown quantity of a current parallel to a side of the triangular shell element.

8. The storage medium according to claim 7, wherein the non-zero unknown quantity of the current parallel to the side of said triangular shell element is obtained by integrating the unknown quantity of the current parallel to said side from each side to an apex opposite to said side except for an apex representing a starting point.

9. A method to determine an electric field intensity emitted from a device using a moment technique, comprising:

dividing, virtually, the device into a mesh to provide a plurality of shell elements including a triangular shell element, wherein mutual impedance between shell elements and a supplied voltage are known and a current flowing through the triangular shell element is unknown;

preparing two triangles congruent to the triangular shell element to provide three congruent triangles whose vertices represent three starting points;

for each triangle, using a non-overlapping starting point and:

if current flows from the starting point to an outside of the triangle or an element fails to be adjacent to a side opposite the starting point, integrating non-zero unknown quantities of currents along line segments parallel to a side of each triangle opposite the starting point except for a value at each starting point, and if an element is adjacent to a side opposite the starting point, integrating non-zero unknown quantities of currents along line segments parallel to a side of each triangle when the side is in common with a side of another shell element.

* * * * *

UNITED STATES PATENT AND TRADEMARK OFFICE
CERTIFICATE OF CORRECTION

PATENT NO. : 6,691,076 B1
DATED : February 10, 2004
INVENTOR(S) : Kanji Nagase et al.

It is certified that error appears in the above-identified patent and that said Letters Patent is hereby corrected as shown below:

<u>Column 7,</u>
Line 52, change "Plurality" to -- plurality --.

Signed and Sealed this

Fifteenth Day of June, 2004

JON W. DUDAS
*Acting Director of the United States Patent and Trademark Office*